United States Patent
Hashimshony

(10) Patent No.: US 6,486,685 B1
(45) Date of Patent: Nov. 26, 2002

(54) REMOTE RESISTIVITY MEASUREMENT

(75) Inventor: Dan Hashimshony, Moshav Aminadav (IL)

(73) Assignee: Sela Semiconductor Engineering Ltd., Yokneam Elite (IL)

( * ) Notice: Subject to any disclaimer, the term of this patent is extended or adjusted under 35 U.S.C. 154(b) by 0 days.

(21) Appl. No.: 09/554,915

(22) PCT Filed: Nov. 11, 1998

(86) PCT No.: PCT/IL98/00550

§ 371 (c)(1),
(2), (4) Date: Sep. 8, 2000

(87) PCT Pub. No.: WO99/27374

PCT Pub. Date: Jun. 3, 1999

(30) Foreign Application Priority Data

Nov. 21, 1997 (IL) ............................. 122273

(51) Int. Cl.[7] ........................................... G01R 31/26
(52) U.S. Cl. ........................................... 324/719
(58) Field of Search ............................. 324/642, 719, 324/750

(56) References Cited

U.S. PATENT DOCUMENTS

| | | | |
|---|---|---|---|
| 3,136,946 A | 6/1964 | Levine | 324/58.5 |
| 4,818,930 A | 4/1989 | Flemming et al. | 324/58.5 |
| 4,922,091 A | 5/1990 | Grischkowsky | 250/211 |
| 4,933,542 A | 6/1990 | Bokor et al. | 250/211 |
| 4,968,945 A | 11/1990 | Woskov et al. | 324/633 |
| 4,972,069 A | 11/1990 | Grischkowsky | 250/211 |
| 5,023,561 A * | 6/1991 | Hillard | 324/719 |
| 5,056,111 A | 10/1991 | Duling, III et al. | 375/37 |
| 5,083,088 A | 1/1992 | Bereskin | 324/632 |
| 5,103,182 A | 4/1992 | Moslehi | 324/642 |
| 5,136,249 A | 8/1992 | White et al. | 324/643 |
| 5,144,245 A | 9/1992 | Wisler | 324/338 |
| 5,187,443 A | 2/1993 | Bereskin | 324/632 |
| 5,187,449 A | 2/1993 | May | 331/66 |
| 5,196,786 A | 3/1993 | Usami et al. | 324/158 |
| 5,233,306 A | 8/1993 | Misra | 324/601 |
| 5,239,269 A | 8/1993 | Martens et al. | 324/632 |
| 5,241,279 A | 8/1993 | Boniort et al. | 324/636 |
| 5,367,262 A | 11/1994 | Manning | 324/341 |

(List continued on next page.)

FOREIGN PATENT DOCUMENTS

| | | |
|---|---|---|
| DE | 3029295 | 2/1981 |
| FR | 1596799 | 7/1970 |
| FR | 2545221 | 11/1984 |
| SU | 813231 | 3/1981 |

OTHER PUBLICATIONS

Abstract of French Patent FR 1596799A dated Jul. 31, 1970.
Abstract of French Patent FR 2545221A dated Nov. 2, 1984.
Abstract of Russian Patent SU813231B dated Mar. 15, 1981.
Abstract of German Patent DE 3029295 A dated Feb. 1981.
M. Schall et al., "C.2 Terahertz–Time–Domain–Spectroscopy", *Laser Based Diagnostics* (web address: http://frheww-ww.physik.uni–freiburg_de/guide_mai96/c_2.htm, http://frhewww.physik.uni–freiburg_de/guide_mai96/bilder/fig_c_2_1.htm).
V. Schyja & S. Krieg, "B.1 Femtosecond Laser Sources" (web address: http://frhewww.physik.uni–freiburg_de/guide_mai96/b_1.htm, http://frhewww.physik.uni–freiburg_de/guide_mai96/fig_c_1_1.htm).

*Primary Examiner*—N. Le
*Assistant Examiner*—Etienne P LeRoux
(74) *Attorney, Agent, or Firm*—Ladas & Parry

(57) ABSTRACT

Apparatus and method for measuring surface resistivity of a wafer (12). A source of high frequency radiation (6, 41) emits an incident wave burst that impinges the wafer at a desired spot location. A reflected wave burst is detected at an appropriate time window by a receiver (8, 42). The relationship between incident and reflected energies is a function of the surface resistivity of the wafer.

9 Claims, 3 Drawing Sheets

U.S. PATENT DOCUMENTS

| | | | |
|---|---|---|---|
| 5,406,214 A | 4/1995 | Boda et al. | 324/765 |
| 5,440,238 A | 8/1995 | Martens et al. | 324/636 |
| 5,442,297 A | 8/1995 | Verkuil | 324/702 |
| 5,493,433 A | 2/1996 | Prucnal et al. | 359/123 |
| 5,502,394 A | 3/1996 | Piau | 324/646 |
| 5,543,960 A | 8/1996 | Carrig et al. | 359/326 |
| 5,574,379 A | 11/1996 | Darling, Jr. | 324/642 |
| 5,594,351 A | 1/1997 | Hearn | 324/637 |
| 5,623,145 A | 4/1997 | Noss | 250/330 |
| 5,631,489 A | 5/1997 | Roser | 257/449 |
| 5,665,999 A | 9/1997 | Brugger | 257/472 |
| 5,710,430 A | 1/1998 | Nuss | 250/358.1 |
| 5,729,017 A | 3/1998 | Brener et al. | 250/338.1 |
| 5,789,750 A | 8/1998 | Nuss | 250/338.1 |
| 5,929,644 A * | 7/1999 | Sokolov | 324/750 |

* cited by examiner

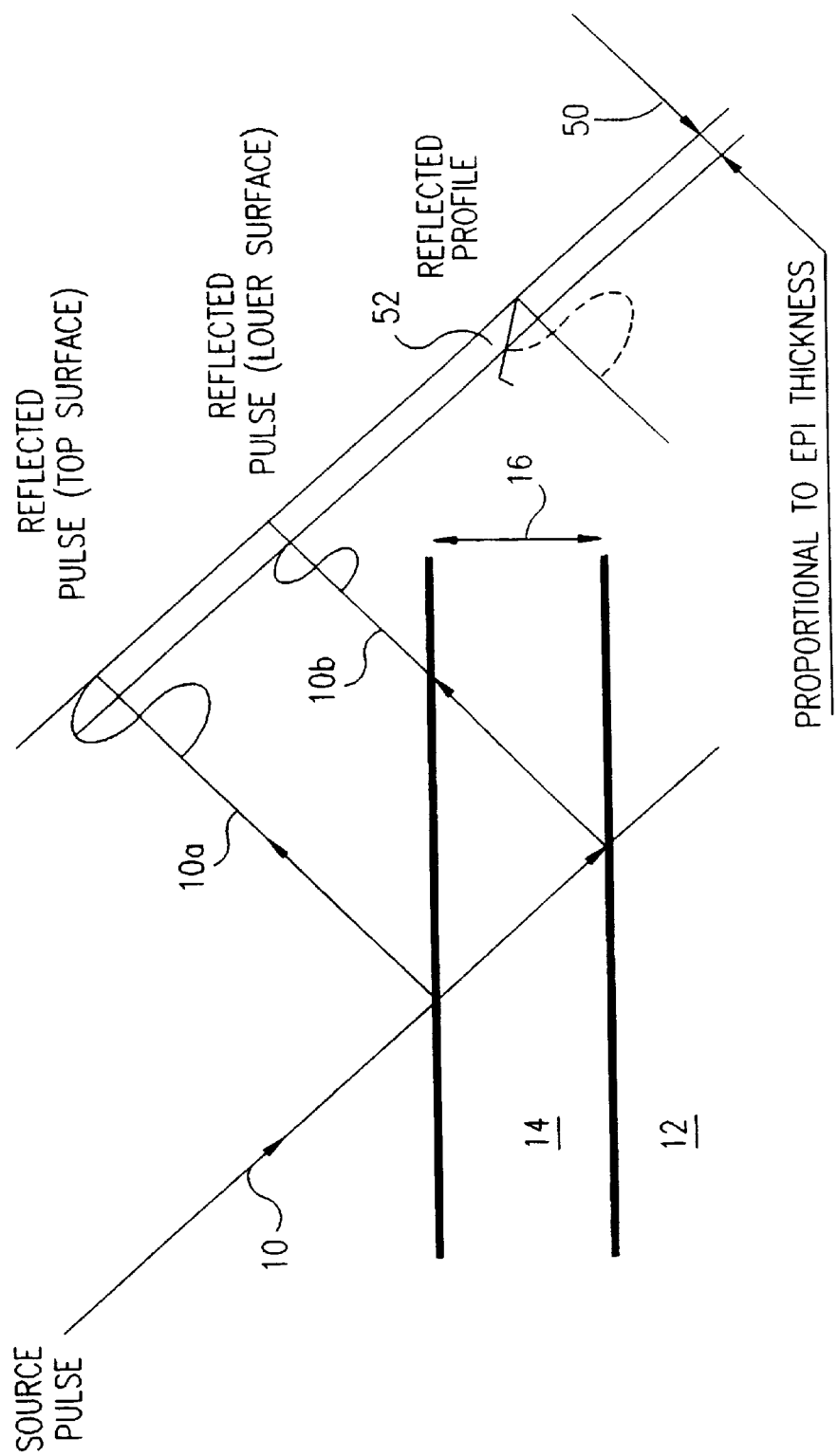

REMOTE RESISTIVITY MEASUREMENT

FIELD OF THE INVENTION

The present invention relates to remote measurement and more particularly but not exclusively to remote, that is to say non-contact, methods of measuring resistivity. and/or thickness.

BACKGROUND OF THE INVENTION

In the manufacture of silicon chips the outer surface of the silicon substrate is often coated with a layer known as an epitaxial layer (or epilayer). The purpose of this layer is to give additional quality to the substrate because the epitaxial layer can be made more close to a perfect crystal. The epitaxial layer has dopant which is added during the plasma phase and is of high resistivity relative for example to metal. The substrate has qualities of its own and also contains features in the sub-micron region. The epitaxial layer covers defects in the substrate.

A typical thickness of an epitaxial layer is 5–50 $\mu$m. In order to control the manufacturing process of such thin layers it is necessary to take measurements dynamically during the process. In particular it is necessary to monitor the resistivity. Measurements should preferably not interfere with the manufacturing process itself There is known a method of measuring the resistivity of surfaces by radiating the surface with microwaves. The reflections of the microwaves from the surface are affected by the resistivity of the surface so that, following suitable calibration, a measurement of resistivity may be made.

Measurements of this sort are appropriate for homogeneous blocks of material. They cannot, however, be carried out on very thin layers.

SUMMARY OF THE INVENTION

The present invention seeks to enable the measurement of properties of an upper thin layer on the surface of a block of material, that is to say to measure such properties as resistivity and thickness. It is possible to eliminate the difficulty of having reflections from different material layers by setting a receiver to receive signals during a very short time window. Reflections from anything but the top layer do not have time to arrive during this window.

According to the present invention there is provided apparatus for non-contact measurement of resistivity of a surface layer of a wafer, typically a semiconductor wafer with a coating which is an epitaxial layer. The apparatus comprises a source of high frequency radiation, for irradiating the wafer, a detector of high frequency radiation, positioned to detect radiation from the source reflected from the wafer, and a high speed switching device, operatively connected to both said detector and said source, and operable to switch on the detector in time to receive radiation reflected from the surface layer of the wafer. The high frequency radiation is preferably in the sub-millimeter wavelength range. The time interval between the switching on of the detector and switching off of the detector may be in the order of $10^{-13}$ seconds.

In an embodiment the high speed switching device is an optical switching device, and may comprise a laser or other light source, a beam splitting device and an array of mirrors arranged to form a delay path for one of the two beams emerging from the beam splitting device. One beam heads directly for the short r.f. source and generates a pulse. The delayed beam goes to the detector and serves as an on signal. Preferably the array of mirrors is adjustable to enable the delay path to be altered.

BRIEF DESCRIPTION OF THE DRAWINGS

For a better understanding of the invention and to show how the same may be carried into effect, reference will now be made, purely by way of example, to the accompanying drawings in which, FIG. 2 shows a detail of a timing mechanism for use in the apparatus of FIG. 1, and.

FIG. 3 is a schematic diagram showing how a thickness measurement can be carried out.

DESCRIPTION OF THE PREFERRED EMBODIMENTS

Figure 1:
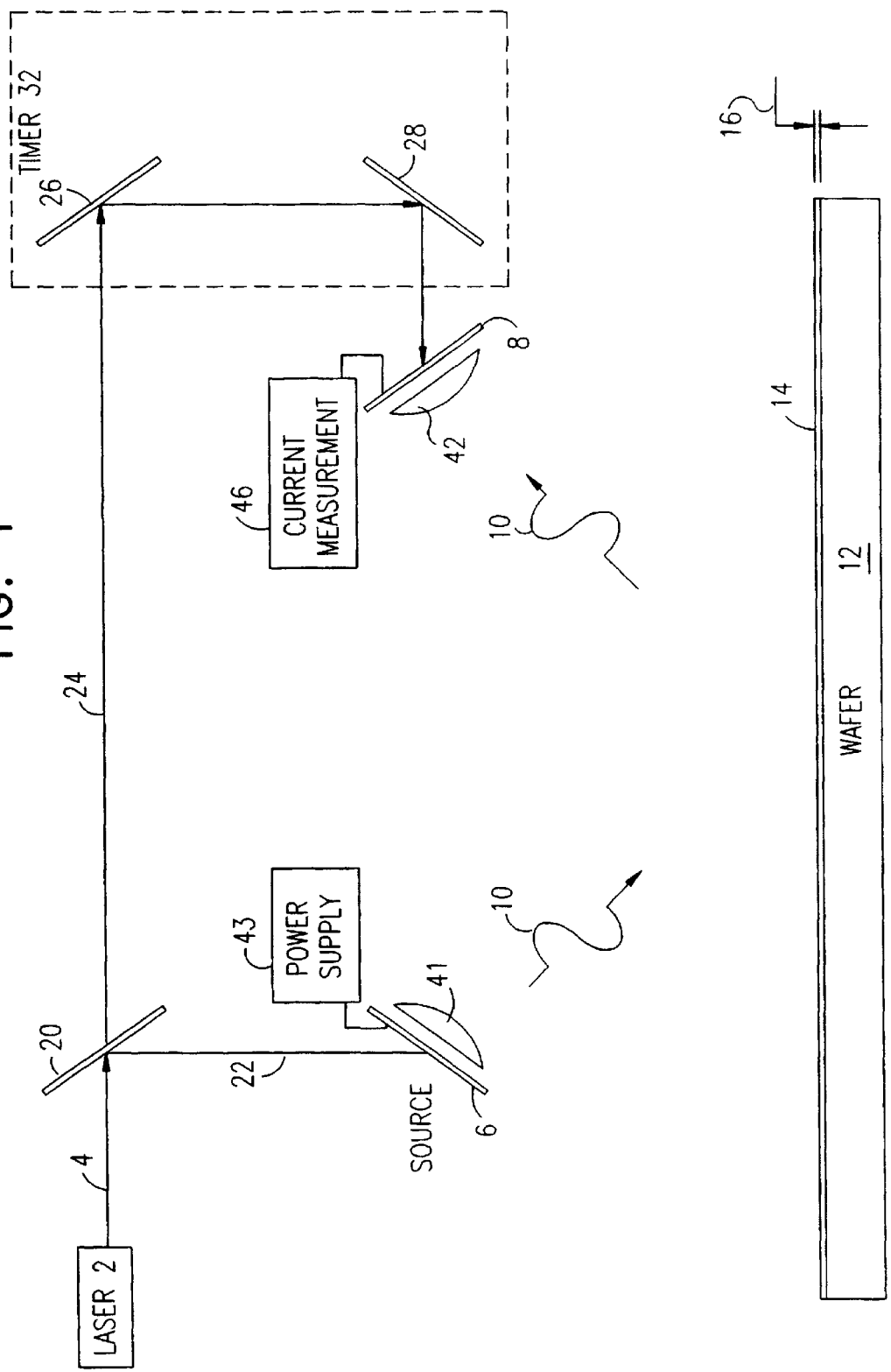
FIG. 1 shows apparatus for carrying out remote resistivity measurements in accordance with an embodiment of the invention.

FIG. 1 shows apparatus for carrying out remote resistivity measurements in accordance with an embodiment of the invention.

In general the apparatus comprises an optically gated rf pulse source 6 for irradiating a wafer 12, and an optically gated antenna detector 8, positioned to detect radiation 10 from the source 6 reflected from the wafer 12. The source 6 generates short bursts of radiation in the submillimeter range whenever triggered by an optical beam 4, 22, and triggering may occur with a repetition rate of perhaps 100 MHz. The exact frequency range used in any specific measurement must be selected such that in that range the rf resistivity measured is equal to the dc resistivity of the wafer. All the pulses are preferably identical in amplitude and in phase. The optically gated detector generates a current that is proportional to the electric field of the reflected beam within the time range between triggering by an optical beam and the time it is shut down automatically by itself. The interval to automatic shutdown may typically be less than 500 fs. Following issuance of the beam to be reflected the optical beam triggers the detector after a preselected delay time. The start of the delay may be changed dynamically during the process. A reflection profile may thus be built up from measurements over different delays.

Figure 2:
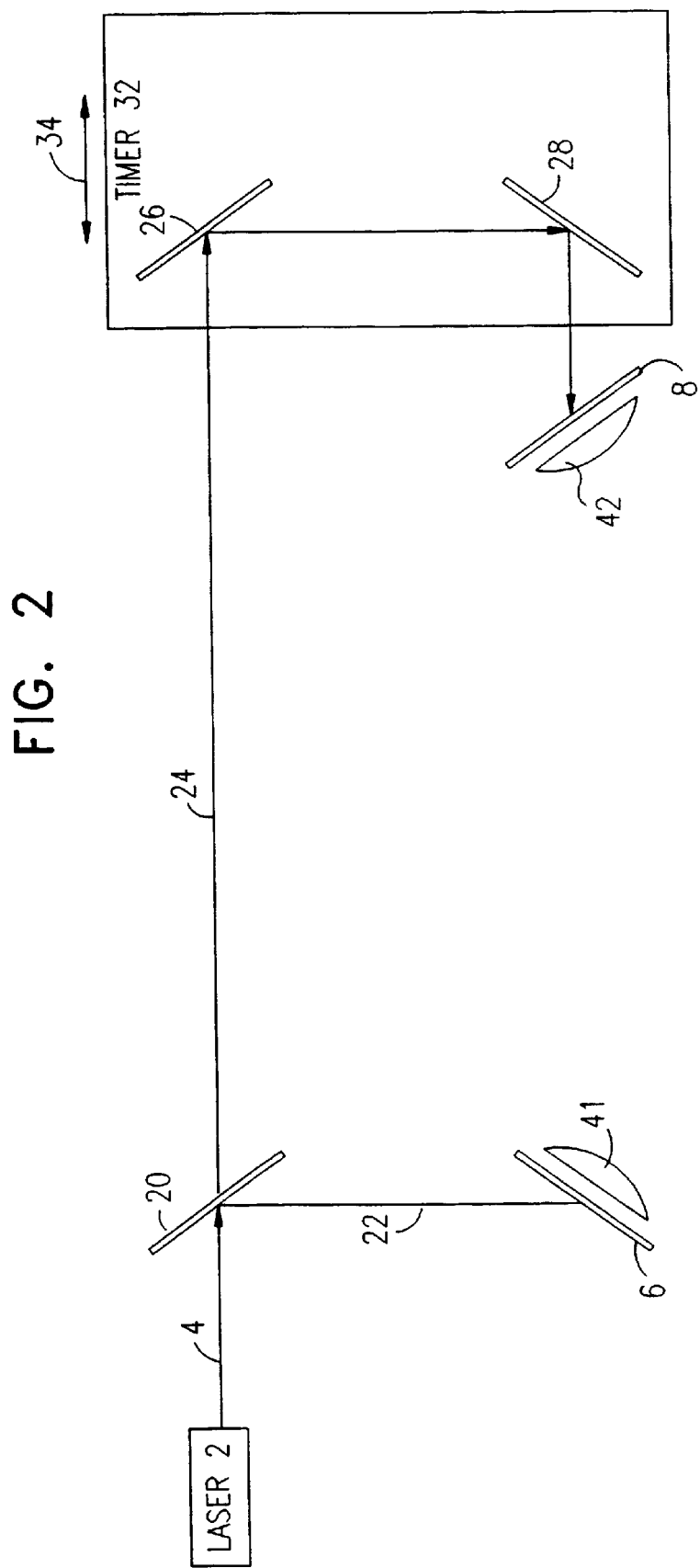

A laser 2 is used to provide the timing beam 4 mentioned above for switching on a source 6 and a detector 8. The use of the laser 2 in providing a timing beam will be described in more detail with respect to FIG. 2 below. The source 6 is connected to a DC voltage supply 43 and produces a short burst of r.f. radiation 10 directed at a wafer 12, in response to the timing signal from the laser 2. The signal is focused by lens 41 to a spot on the surface of an epilayer 14. The wafer is coated with the epilayer 14 which has a thickness 16, typically between 5 and 50 $\mu$m. The signal 10 is reflected off the epilayer 14 and is focused by lens 42 onto the center of the antenna detector, 8. The beam is partly picked up by the detector 8 when the detector 8 is struck from behind by beam 24 (FIG. 2). The average current produced by the detector is measured by a lock-in amplifier or by a box car integrator 46.

The measurement is done repetitively and the average value of the field is saved for each time interval. After that, the delay time between the source and the detector is changed slightly by moving the platform 32. This alters the path length of the timing beam 24, and the repetitive measurement process is repeated for the new delay. The delay is altered several more times and a graph of reflection value against delay time is built up. The graph is in fact the fill profile of the reflection and analysis thereof can reveal the resistivity and the thickness of the epitaxial layer.

The signal 10 is reflected off the epitaxial layer 14 and part of it is picked up by the detector 8. The reflection is qualitatively changed by the resistivity of the layer and the detector is able to determine the resistivity of the layer from this qualitative change. The wafer material itself is of a different resistivity, and so a time delay can be measured between reflections arriving from the epilayer and from the wafer. From this delay the thickness of the layer can be determined.

Two exemplary radiation paths 10a, and 10b, are shown (see FIG. 3). Path 10a reaches the detector after reflection from the top of the epilayer 14. Path 10b reaches the detector from the bottom of epilayer 14. The two beams can be detected independently. That is to say light is detected from within a depth window. By altering the delay time the depth window is moved so that a depth profile can be built up.

The timing mechanism is based on the laser 2 and is shown in schematic form in FIG. 2. The beam of laser light 4 strikes a beam splitter or partially strikes a mirror, shown as 20. The beam 4 is split into two parts, 22 and 24. Beam 22 travels directly to the radiation source 6. Beam 24, however, is reflected by the beam splitter or mirror 20 to mirrors 26, 28, so as to be delayed in its arrival at the detector 8.

Different delay times, and thus different delay paths, are needed. Hence mirrors 26 and 28 are preferably mounted on a moving platform 32. The platform 32 moves as indicated by arrow 34.

The delay path is preferably changed during the measuring process itself. The delay time may thus be changed in small steps between measurements of succeeding pulses (for example every 1000 pulses) so as to move in a controlled way across the reflection profile.

For a typical 30 $\mu$m thickness of the epilayer, a 300 GHz (center frequency) radiation pulse and a detector open for 100 fs, a delay path of 1 $\mu$m will give a 3 fs delay step. One thousand steps may be needed to cover the full reflection profile (each with a thousand pulses). However after approximately the first 60 steps the reflection from the underlying substrate will begin to appear in the reflection graph. By initializing the zero delay to the path length the measurement can be made even when the detector window time is the same as the time it takes the radiation to pass through the epilayer.

The resistivity is calculated as follows, the reflected electric field, as determined by current measurement unit 46, is compared with the incident electric field, whose value is known, to give a ratio $\Gamma$, which is a reflection coefficient. The resistivity can then be obtained from the following equation $$\Gamma = \frac{\sqrt{(1/\epsilon_0)} - \sqrt{(j\omega/(\sigma_s + j\omega\epsilon_s))}}{\sqrt{(1/\epsilon_0)} + \sqrt{(j\omega/(\sigma_s + j\omega\epsilon_s))}}$$

where $\epsilon_0$=constant, $\omega$=source frequency, $\sigma_s$=epi-layer conductivity (conductivity being the reciprocal of the resistivity), and $\epsilon_s$=dielectric coefficient.

FIG. 3 shows a source pulse 10 incident on an epilayer 14 that coats a silicon substrate 12. A first reflected beam 10a is reflected from the top of the epilayer and a second reflected beam 10b is reflected from the bottom of the epilayer. The timing arrangement allows the various reflected beams to be distinguished and a step in the overall profile 52 can be detected to give a measure 50 proportional to the thickness of the epilayer. The resistivity calculation only uses the reflection 10a from the upper surface of the epilayer.

There is thus provided a non-contact, non destructive method of measuring upper epitaxial layer resistivity. No parts of the measuring apparatus need be located within the chamber in which manufacture of the wafer is taking place and yet real time measurements can be made. Typically the measuring apparatus would be sited outside a window of a reaction chamber and would be able to measure the resistivity of the epilayer in real time as it is being manufactured. The measurements can thus be used dynamically to control the process.

Thus, by setting a receiver to receive signals during a very short time window and by changing the opening time of that window after a number of pulses, the fill profile of the electric field of the reflection can be recovered. By analyzing the reflected profile both the resistivity and the thickness of the upper layer can be computed directly. The resistivity is measured by comparing the original pulse electric field with the reflected signal electric field and the thickness is measured by identifying the first measurement in which reflection from the substrate begins to appear in the full reflection profile. The thickness of the epilayer may be calculated from the associated time delay.

The measurement spatial resolution of this method is about 1 mm square and it is limited by the ability to focus the radiation in use. A single point resistivity and thickness determination may take about 1 second and thus the chip manufacturing process is not held up unduly. The same method may be used with a scanning mechanism for a many point measurement.

What is claimed is:

1. Apparatus for non-contact measurement of resistivity of a surface layer of a wafer, said surface layer having a depth, the apparatus comprising:
    a source of high frequency radiation, for irradiating said wafer;
    a detector of high frequency radiation, positioned to detect radiation from said source reflected from said wafer; and
    a high speed switching device operable to switch on said detector following a first predetermined delay to switch off said detector after a second predetermined delay.

2. Apparatus according to claim 1, wherein said high frequency radiation is in the Terra-Hertz range.

3. Apparatus according to claim 1, wherein a time interval between the switching on of the detector and switching off of the detector is in the order of 10–1 seconds.

4. Apparatus according to claim 1, wherein said first predetermined delay is adjustable.

5. Apparatus according to claim 1, wherein said high speed switching device is an optical switching device.

6. Apparatus according to claim 5, wherein said high speed switching device comprises a light source, a beam splitting device and an array of mirrors arranged to form a delay path for a beam emerging from said beam splitting device.

7. Apparatus according to claim 6, wherein said array of mirrors is adjustable to enable said delay path to be altered.

8. Apparatus according to claim 1, wherein said detector converts said detected radiation into an electric current having a given current level, said current level being proportional to a quality of the received radiation.

9. A method for non-contact measurement of resistivity of a surface layer of a wafer, said surface layer having a depth, comprising the steps of:
    employing a source of high frequency radiation for irradiating said wafer;
    employing a detector for detecting radiation from a selected point on said wafer; and
    employing a high speed switching device to switch said detector on and off, thereby to enable detection of the resistivity of said surface layer.

* * * * *